United States Patent
Kodama et al.

(10) Patent No.: US 10,111,367 B2
(45) Date of Patent: Oct. 23, 2018

(54) LIQUID IMMERSION COOLING APPARATUS, LIQUID IMMERSION COOLING SYSTEM, AND CONTROL METHOD OF LIQUID IMMERSION COOLING APPARATUS

(71) Applicant: FUJITSU LIMITED, Kawasaki-shi, Kanagawa (JP)

(72) Inventors: Hiroyoshi Kodama, Isehara (JP); Hiroshi Endo, Atsugi (JP); Yukiko Wakino, Sagamihara (JP); Satoshi Inano, Minoh (JP); Hiroyuki Fukuda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/498,683

(22) Filed: Apr. 27, 2017

(65) Prior Publication Data

US 2017/0354066 A1    Dec. 7, 2017

(30) Foreign Application Priority Data

Jun. 1, 2016    (JP) .................................. 2016-109846

(51) Int. Cl.
*H05K 7/20*    (2006.01)

(52) U.S. Cl.
CPC ..... *H05K 7/20836* (2013.01); *H05K 7/20236* (2013.01); *H05K 7/20772* (2013.01); *H05K 7/20818* (2013.01)

(58) Field of Classification Search
CPC .............. H01L 23/473; H05K 7/20781; H05K 7/20836; H05K 7/20281; H05K 7/203; H05K 7/20772; H05K 7/2079; H05K 7/20236; H05K 7/20272; H05K 7/20327; H05K 7/20381; H05K 7/20763; H05K 7/20827; H05K 7/20927; H05K 9/0083; F28D 15/00; G06F 1/20; G06F 1/206; G06F 2200/201

See application file for complete search history.

(56) References Cited

U.S. PATENT DOCUMENTS

| | | | | |
|---|---|---|---|---|
| 3,858,090 A * | 12/1974 | Lehmann | ........... | H05K 7/20236 165/104.33 |
| 4,619,316 A * | 10/1986 | Nakayama | ............ | F28F 13/187 165/104.33 |
| 4,704,658 A * | 11/1987 | Yokouchi | ............... | H05K 7/203 165/104.33 |
| 8,369,091 B2 * | 2/2013 | Campbell | ................ | F28F 3/04 165/104.33 |

(Continued)

FOREIGN PATENT DOCUMENTS

| | | |
|---|---|---|
| JP | 4-170097 | 6/1992 |
| JP | 2012-33719 | 2/2012 |

*Primary Examiner* — James Wu
*Assistant Examiner* — Michael Matey
(74) *Attorney, Agent, or Firm* — Staas & Halsey LLP

(57) ABSTRACT

A liquid immersion cooling apparatus that cools an electronic device including a heat generating element, the apparatus includes a liquid immersion tank that accommodates a cooling liquid and the electronic device to be immersed in the cooling liquid, a wall that is disposed within the liquid immersion tank, the wall having a protrusion protruding toward the electronic device, and a drive mechanism that moves a position of the protrusion along the electronic device.

13 Claims, 20 Drawing Sheets

(56) References Cited

U.S. PATENT DOCUMENTS

| | | | |
|---|---|---|---|
| 9,273,906 B2* | 3/2016 | Goth | F28D 1/0477 |
| 2009/0231810 A1* | 9/2009 | Liang | H01L 23/473 |
| | | | 361/699 |
| 2014/0284028 A1* | 9/2014 | Yoshida | H01L 23/473 |
| | | | 165/104.19 |
| 2014/0332728 A1* | 11/2014 | Goino | C04B 38/00 |
| | | | 252/478 |
| 2015/0000319 A1* | 1/2015 | Smith | H05K 7/20218 |
| | | | 62/260 |
| 2015/0043165 A1* | 2/2015 | Best | H05K 7/20763 |
| | | | 361/699 |
| 2015/0272537 A1* | 10/2015 | Laugharn, Jr. | G10K 11/28 |
| | | | 181/142 |
| 2016/0128232 A1* | 5/2016 | Chainer | H01L 23/3735 |
| | | | 361/700 |
| 2016/0286694 A1* | 9/2016 | Krishnan | H05K 7/20772 |
| 2017/0265336 A1* | 9/2017 | Ichinose | H05K 7/20772 |
| 2017/0280587 A1* | 9/2017 | Watanabe | H05K 7/20272 |

* cited by examiner

FIG. 9

|  | CURRENT VALUE (°C) | THRESHOLD VALUE (°C) |
|---|---|---|
| CPU 0 | 32 | 60 |
| CPU 1 | 33 | 60 |
| MEMORY TEMPERATURE 1 | 30 | 80 |
| MEMORY TEMPERATURE 2 | 31 | 80 |
| PCI TEMPERATURE | 30 | 65 |
| PSU TEMPERATURE | 33 | 70 |
| NIC TEMPERATURE | 31 | 65 |
| COOLING LIQUID TEMPERATURE 1 | 21 | 40 |
| COOLING LIQUID TEMPERATURE 2 | 22 | 40 |

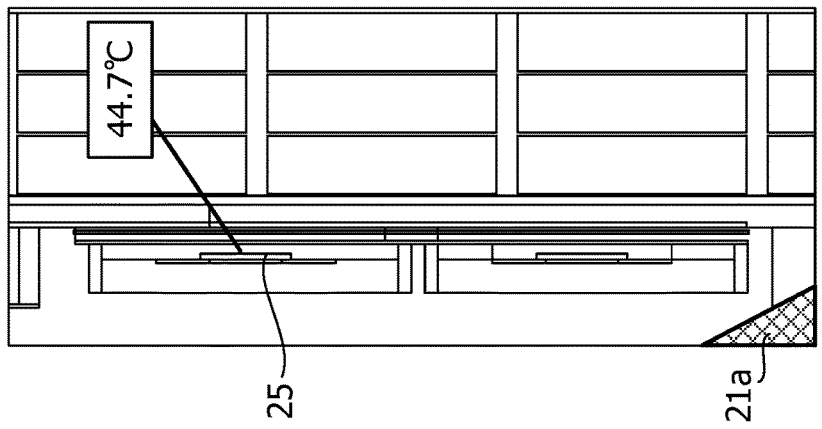
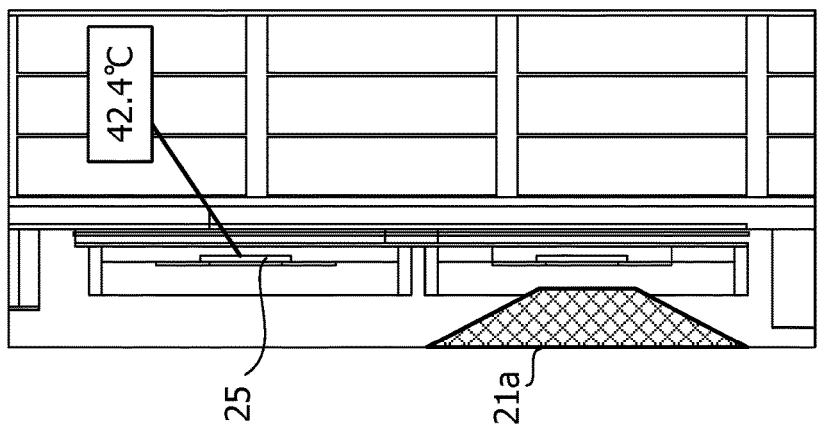
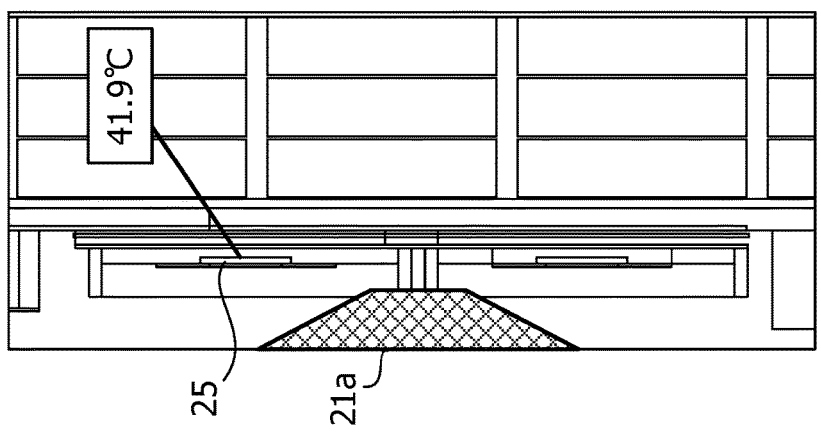

FIG. 18

|  | COMPARATIVE EXAMPLE | EXAMPLE |
|---|---|---|
| FLOW RATE | 1 L/min | 0.73 L/min |
| CPU TEMPERATURE | 39.2 °C | 40.5 °C |
| PUMP POWER | 12 kW | 7.3 kW |
| FAN POWER | 0 kW | ABOUT 1 kW |
| SUM | 12 kW. | 8.3 kW. | ically
LIQUID IMMERSION COOLING APPARATUS, LIQUID IMMERSION COOLING SYSTEM, AND CONTROL METHOD OF LIQUID IMMERSION COOLING APPARATUS

CROSS-REFERENCE TO RELATED APPLICATION

This application is based upon and claims the benefit of priority of the prior Japanese Patent Application No. 2016-109846, filed on Jun. 1, 2016, the entire contents of which are incorporated herein by reference.

FIELD

The embodiments discussed herein are related to a liquid immersion cooling apparatus, a liquid immersion cooling system, and a control method of the liquid immersion cooling apparatus.

BACKGROUND

Recently, it has been required to mount an information and communication technology (ICT) devices, such as, for example, a server and a storage, at a high density in a data center. On the other hand, with the high integration of semiconductors, such as, for example, processors mounted in the ICT devices, the heating value of the ICT devices is increasing.

When the ICT devices, of which the heating value is large, are mounted at a high density, the temperature of the ICT devices may exceed the allowable upper limit temperature, thereby causing malfunction or failure. Therefore, there is a demand for a cooling method that is capable of sufficiently cooling the ICT devices, of which the heating value is large, even if the ICT devices are mounted at a high density.

As one of the cooling methods, it has been proposed to cool an electronic component, of which the heating value is large, by immersing the electronic component in a cooling liquid.

When electronic devices, of which the heating value is large, are mounted at a high density, a large amount of electric power is required in order to sufficiently cool the electronic devices.

The followings are reference documents.
[Document 1] Japanese Laid-Open Patent Publication No. 04-170097 and
[Document 2] Japanese Laid-Open Patent Publication No. 2012-033719.

SUMMARY

According to an aspect of the invention, a liquid immersion cooling apparatus that cools an electronic device including a heat generating element, the apparatus includes: a liquid immersion tank that accommodates a cooling liquid and the electronic device to be immersed in the cooling liquid; a wall that is disposed within the liquid immersion tank, the wall having a protrusion protruding toward the electronic device; and a drive mechanism that moves a position of the protrusion along the electronic device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 is a view illustrating exemplary data stored in a storage unit;

FIGS. 11A to 11C are views (Part 2) illustrating the result of simulating a variation in the temperature of a CPU when the wall unit is moved;

FIG. 18 is a view illustrating the result of simulating the effect of the second exemplary embodiment (example) in comparison with a comparative example;

DESCRIPTION OF EMBODIMENTS

Hereinafter, prior to describing the exemplary embodiments, preliminary contents for facilitating the understanding of the exemplary embodiments will be described.

Figure 1:
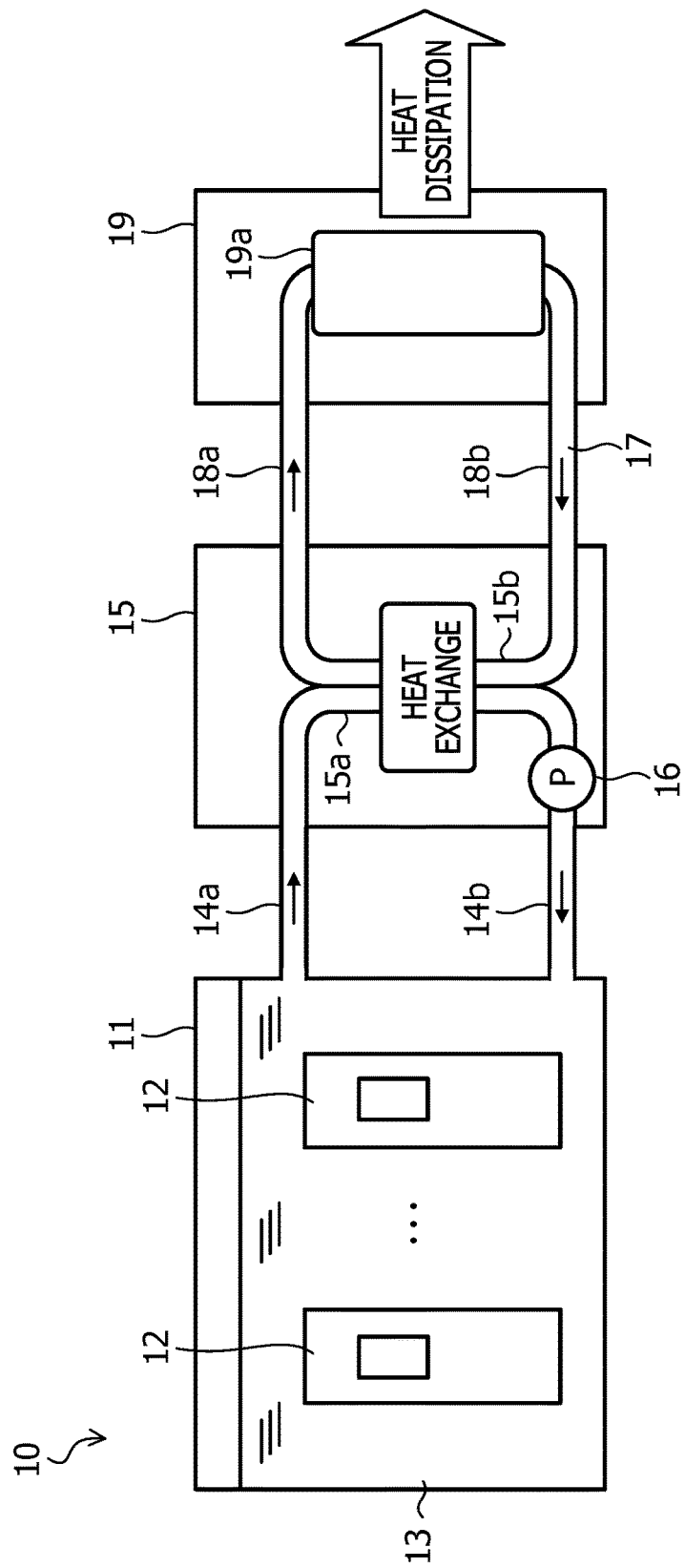
FIG. 1 is a schematic view illustrating an exemplary liquid immersion cooling system.

FIG. 1 is a schematic view illustrating an exemplary liquid immersion cooling system.

The liquid immersion cooling system 10 illustrated in FIG. 1 includes a liquid immersion tank 11, a heat exchanger 15, and a chiller 19.

A cooling liquid 13 is contained in the liquid immersion tank 11, and a plurality of servers 12 is immersed in the cooling liquid 13. An example of the cooling liquid 13 is a fluorine-based inert liquid. A cooling liquid inlet is formed in the lower portion of the liquid immersion tank 11, and a pipe 14b is connected to the cooling liquid inlet. Further, a cooling liquid outlet is formed in the upper portion of the liquid immersion tank 11, and a pipe 14a is connected to the cooling liquid outlet.

The other end side of the pipe 14a is connected to an inlet of a primary side flow path (cooling liquid flow path) 15a of the heat exchanger 15. Further, the other end side of the pipe 14b is connected to a discharge port of a pump 16, and a suction port of the pump 16 is connected to an outlet of the primary side flow path 15a of the heat exchanger 15. By this pump 16, the cooling liquid 13 circulates between the liquid immersion tank 11 and the primary side flow path 15a of the heat exchanger 15.

The heat generated by the operation of the servers 12 moves from the servers 12 to the cooling liquid 13, which flows around the servers 12, and further moves to the primary side flow path 15a of the heat exchanger 15 via the movement of the cooling liquid 13.

Meanwhile, a compressor 19a is provided in the chiller 19. A coolant inlet of the compressor 19a and an outlet of a secondary side flow path (coolant flow path) 15b of the heat exchanger 15 are connected to each other by a pipe 18a, and a coolant outlet of the compressor 19a and a coolant inlet of the heat exchanger 15 are connected to each other by a pipe 18b. The compressor 19a condenses a gas coolant 17 introduced through the pipe 18a into a liquid.

The coolant 17 changed into a liquid in the compressor 19a is sent to the secondary side flow path 15b of the heat exchanger 15 through the pipe 18b. An expansion valve (not illustrated) is provided in the inlet portion of the secondary side flow path 15b of the heat exchanger 15, and the coolant 17 is changed from the liquid into the gas by passing through the expansion valve. The coolant 17 takes heat (vaporization heat) from the surroundings when the coolant is changed from the liquid to the gas. As a result, the temperature of the cooling liquid 13 passing through the primary side flow path 15a of the heat exchanger 15 decreases, and the temperature of the coolant 17 passing through the secondary side flow path 15b increases. That is, a heat exchange is performed between the cooling liquid 13 passing through the primary side flow path 15a of the heat exchanger 15 and the coolant 17, passing through the secondary side flow path 15b.

The cooling liquid 13, the temperature of which has decreased by heat exchange, returns to the liquid immersion tank 11 through the pump 16. In addition, the coolant 17, the temperature of which has increased by heat exchange, passes through the pipe 18a and moves to the chiller 19 (the compressor 19a). Then, the coolant 17 is compressed by the compressor 19a to be changed into the liquid. At this time, heat (condensation heat) is generated according to the change of the coolant 17 from the gas to the liquid. This heat is dissipated from the chiller 19 into the atmosphere.

In this way, the heat generated in the servers 12 is transported to the heat exchanger 15 by the cooling liquid 13, is further transported from the heat exchanger 15 to the chiller 19 by the coolant 17, and is finally dissipated into the atmosphere.

At this time, the chiller 19 is operated such that, for example, the temperature of the cooling liquid 13 passing through the pipe 14b becomes a predetermined temperature (e.g., 15° C. to 20° C.).

As the coolant 17 that circulates between the chiller 19 and the heat exchanger 15, for example, R407C is used. Further, as the cooling liquid 13 that circulates between the heat exchanger 15 and the liquid immersion tank 11, for example, a fluorine-based inert liquid is used.

However, the fluorine-based inert liquid, which is used as the cooling liquid 13, has an insulation property and also has a density as high as about 1.9 times that of water. Therefore, a large pump is required as the pump 16 for circulating the cooling liquid 13, resulting in an increase in power consumption.

In the following exemplary embodiments, a liquid immersion cooling apparatus and a liquid immersion cooling system, which may sufficiently cool an electronic device and reduce power required for cooling, will be described.

First Exemplary Embodiment

Figure 2:
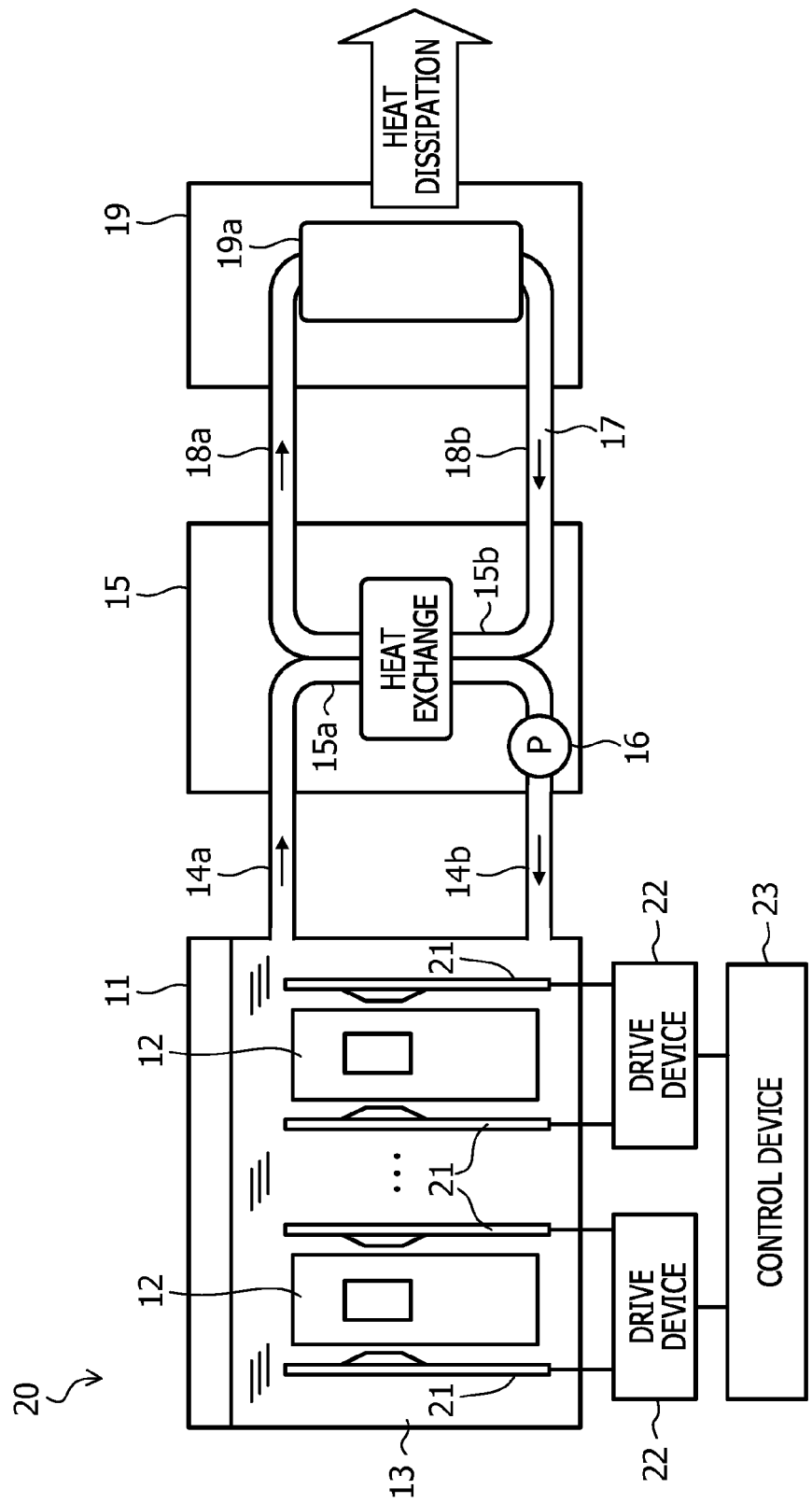
FIG. 2 is a schematic view illustrating a configuration of a liquid immersion cooling system according to a first exemplary embodiment.

FIG. 2 is a schematic view illustrating a configuration of a liquid immersion cooling system according to a first exemplary embodiment. In FIG. 2, the like components as those of FIG. 1 are designated by the like reference numerals.

The liquid immersion cooling system 20 illustrated in FIG. 2 includes the liquid immersion tank 11, the heat exchanger 15, and the chiller 19. The cooling liquid 13 is accommodated in the liquid immersion tank 11, and the plurality of servers 12 is immersed in the cooling liquid 13.

In the present exemplary embodiment, the cooling liquid 13 circulates between the liquid immersion tank 11 and the primary side flow path 15a of the heat exchanger 15. Further, the coolant 17 circulates between the chiller 19 (the compressor 19a) and the secondary side flow path 15b of the heat exchanger 15 while being changed between the gas and the liquid. Further, the heat generated in the servers 12 is transported to the heat exchanger 15 by the cooling liquid 13, is further transported from the heat exchanger 15 to the chiller 19 by the coolant 17, and is finally dissipated into the atmosphere.

In the liquid immersion cooling system 20 according to the present exemplary embodiment, unlike the liquid immersion cooling system 10 illustrated in FIG. 1, a plurality of plate-shaped wall units 21 are vertically disposed in the liquid immersion tank 11. These wall units 21 are driven by a control device 23 via a drive device 22 so as to move in the liquid immersion tank 11 in the vertical direction (the direction parallel to the flow direction of the cooling liquid 13 near the servers 12).

Figure 3:
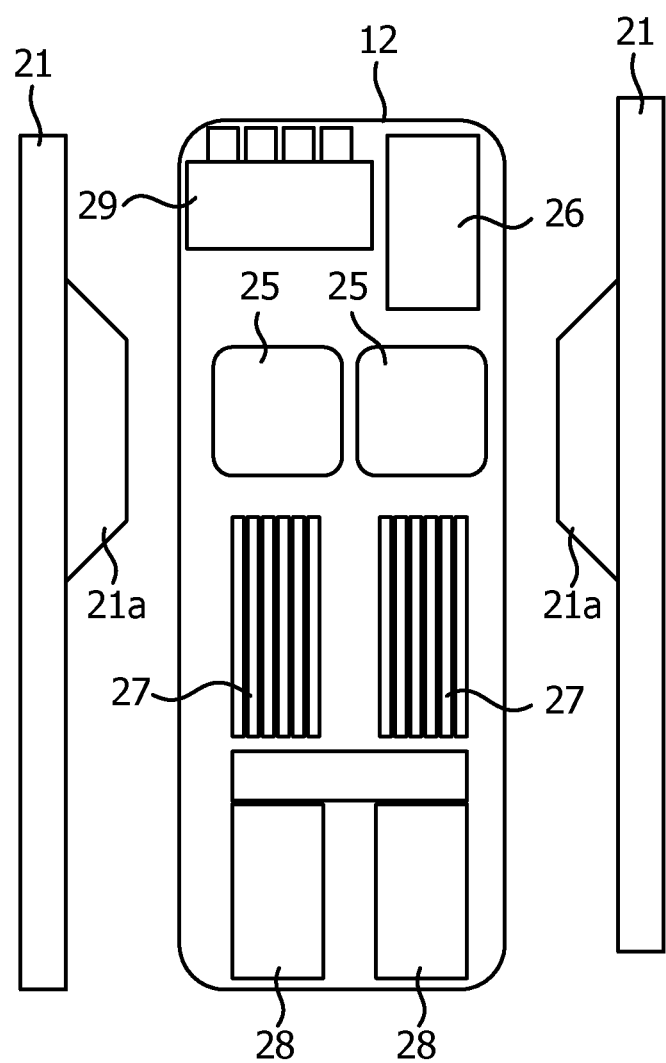
FIG. 3 is a schematic view illustrating a positional relationship between a server and a wall unit.

FIG. 3 is a schematic view illustrating a positional relationship between the server 12 and the wall units 21.

In the present exemplary embodiment, as illustrated in FIG. 3, the wall units 21 are disposed on the opposite sides of the server 12 in the width direction, respectively. Further, each of the wall units 21 is provided with a protrusion 21a that protrudes toward the server 12.

In the server 12, for example, a CPU 25, a power supply unit 26, a memory 27, a storage 28, such as a hard disk or a solid state drive (SSD), and a communication unit 29 are mounted. As described above, although the wall units 21 are driven by the drive device 22 so as to move in the vertical direction, the protrusions 21a are disposed near a component of which the heating value is large (in the present exemplary embodiment, the CPUs 25).

Figure 4:
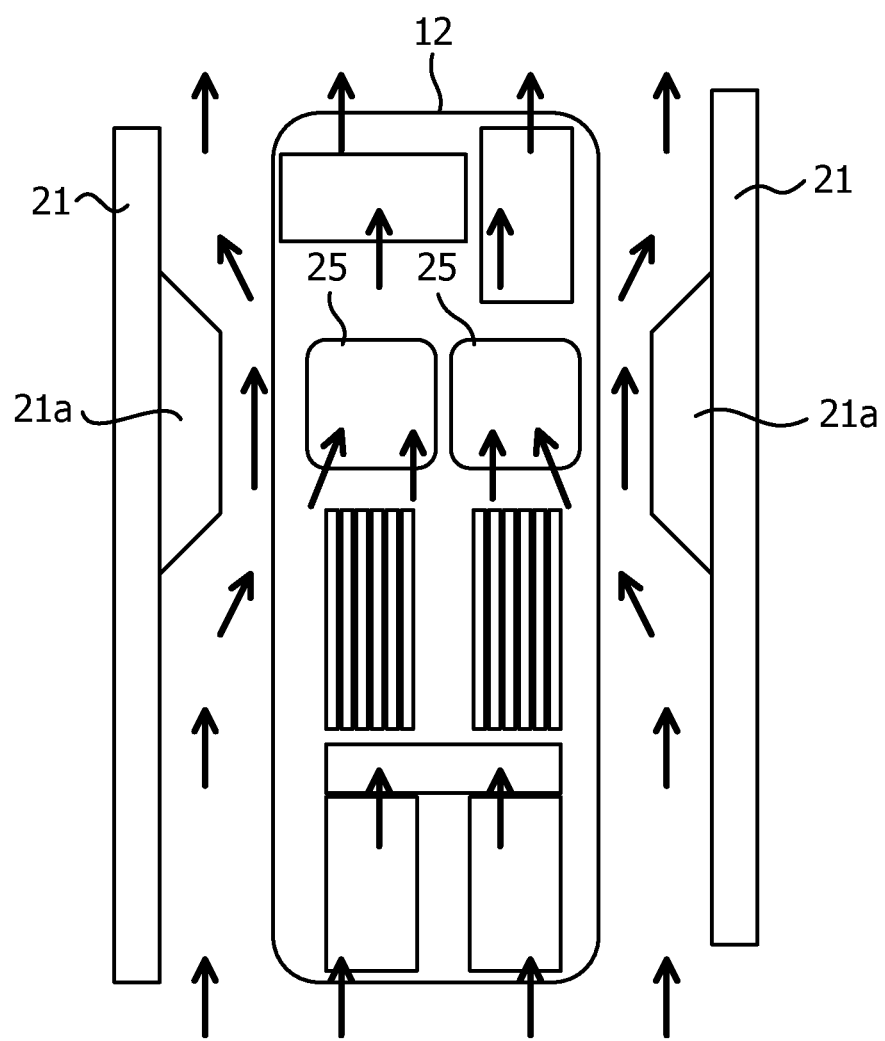
FIG. 4 is a schematic view illustrating the flow of a cooling liquid in a liquid immersion tank with arrows.

FIG. 4 is a schematic view illustrating the flow of the cooling liquid 13 in the liquid immersion tank 11 with arrows.

As described above, since the cooling liquid inlet of the liquid immersion tank 11 is located in the lower portion and the cooling liquid outlet is located in the upper portion, the cooling liquid 13 flows from the bottom to the top in the liquid immersion tank 11. In this case, since the flow path near the CPUs 25 is narrowed by the protrusions 21a, the flow of the cooling liquid 13 between the protrusions 21a is faster than in the upper and lower regions thereof.

That is, assuming that the flow rate of the cooling liquid 13 supplied from the cooling liquid inlet to the inside of the liquid immersion tank 11 is constant, the amount of cooling liquid 13, which comes into contact with the CPU 25 per unit time in the present exemplary embodiment, is large compared with the cooling system 10 illustrated in FIG. 1.

In addition, as illustrated in FIG. 4, since the cooling liquid 13 flows obliquely near the protrusions 21a, the cooling liquid 13 is agitated near the protrusions 21a. As a result, the heat generated from the CPUs 25 diffuses into the cooling liquid 13 passing near the CPUs 25 so that the cooling efficiency is further improved.

Figure 5:
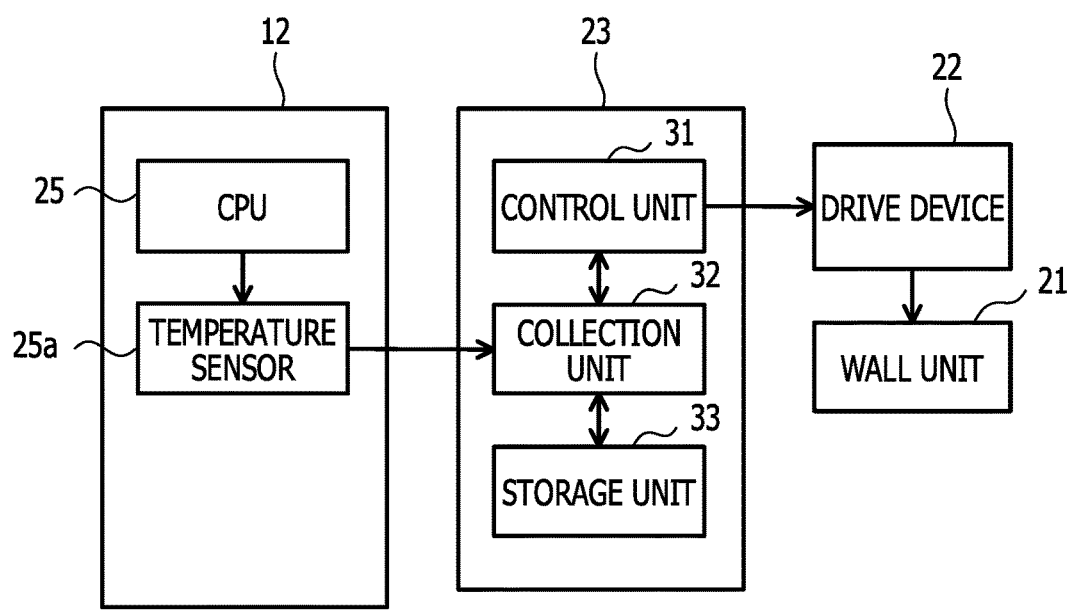
FIG. 5 is a block diagram illustrating a control system of the liquid immersion cooling system according to the first exemplary embodiment.

FIG. 5 is a block diagram illustrating a control system of the liquid immersion cooling system 20 according to the present exemplary embodiment.

The server 12 is provided with a temperature sensor 25a to detect the temperature of a CPU 25. A temperature sensor 25a may be provided in the chip (semiconductor package) of the CPU 25, or may be provided outside the chip. The output of the temperature sensor 25a is transmitted to a control device 23.

The control device 23 includes a control unit 31, a collection unit 32, and a storage unit 33. The output of the temperature sensor 25a is collected by the collection unit 32 and is stored in the storage unit 33. Based on the data stored in the storage unit 33, the control unit 31 moves the wall unit 21 in the vertical direction via the drive device 22.

Figure 6:
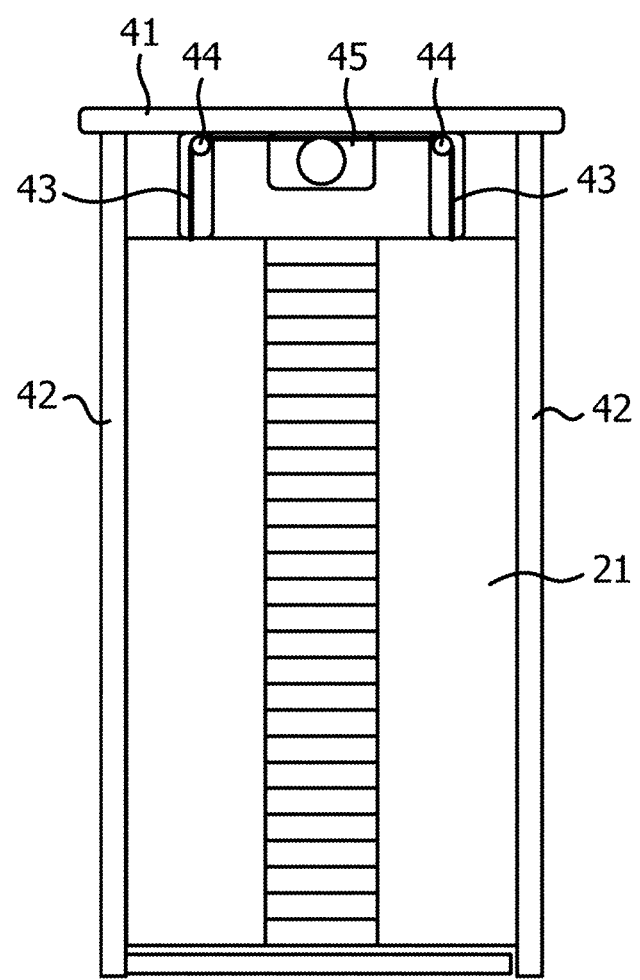
FIG. 6 is a view illustrating an exemplary drive mechanism.

FIG. 6 is a view illustrating an exemplary drive mechanism of the wall unit 21.

In the drive mechanism illustrated in FIG. 6, a winder 45 is attached to a frame 41 disposed above the liquid immersion tank 11. Further, two guide rails 42 are disposed under the frame 41 so as to be separated from each other, and a wall unit 21 is disposed between the guide rails 42.

The wall unit 21 is suspended under the frame 41 by two wires 43. These wires 43 are connected to the winder 45 via pulleys 44. When the winder 45 winds up or unwinds the wires 43, the wall unit 21 moves in the vertical direction along the guide rails 42. The winder 45 is an example of the drive device 23 illustrated in FIG. 4.

Hereinafter, an operation of the liquid immersion cooling system 20 according to the present exemplary embodiment will be described with reference to the flowcharts of FIGS. 7 and 8. In the present exemplary embodiment, the control device 23 simultaneously performs a processing flow illustrated in FIG. 7 and a processing flow illustrated in FIG. 8. First, the processing flow illustrated in FIG. 7 will be described.

First, in step S11, the collection unit 32 acquires the temperature of the CPUs 25 via the temperature sensor 25a. Then, the processing proceeds to step S12, and the collection unit 32 stores the collected temperature data in the storage unit 33. The collection of the temperature data by the collection unit 32 is performed, for example, every minute.

In this way, the storage unit 33 collects temperature data of the CPU 25 depending on a lapse of time. FIG. 9 illustrates an example of data stored in the storage unit 33.

In the example illustrated in FIG. 9, the temperatures of two CPUs 25 (CPU 0 and CPU 1) mounted in the server 12, the temperatures (memory temperature 1, memory temperature 2, PCI temperature, PSU Temperature, and NIC temperature) of the parts other than the CUPs 25 in the server 12, or the temperatures of the cooling liquid 13 (cooling liquid 1 and cooling liquid 2) are measured, and these data are also stored in the storage unit 33. In addition, the threshold values of the temperatures of the respective parts are also stored in advance in the storage unit 33. However, in the present exemplary embodiment, as will be described later, the optimum position of the wall unit 21 is determined only by the temperature of the CPUs 25 (hereinafter, "the temperature of the CPUs" may also be referred to as "CPU temperature").

Subsequently, the processing flow illustrated in FIG. 8 will be described.

First, in step S21, the control unit 31 moves the wall unit 21 in the vertical direction by a predetermined amount (e.g., 1 cm) via the drive device 22. Then, the control unit 31 acquires the current CPU temperature from the storage unit 33.

Subsequently, the processing proceeds to step S22 so that the control unit 31 determines whether or not the movement of the wall unit 21 within a preset range is completed. In the present exemplary embodiment, it is assumed that the wall unit 21 moves within a range of ±20 cm from the initial state (the position where the center of the CPUs 25 and the center of the protrusion 21a are at the same height).

In step S22, when the control unit 31 determines that the movement of the wall unit 21 within the predetermined range is not completed (NO), the processing proceeds to step S21 so that the wall unit 21 is further moved by a predetermined amount and the CPU temperature is acquired.

On the other hand, in step S22, when the control unit 31 determines that the movement of the wall unit 21 within the predetermined range is completed (YES), the processing proceeds to step S23. In step S23, the control unit 31 moves the wall unit 21 to the position where the CPU temperature becomes the lowest with reference to a relationship between the position of the wall unit 21 and the CPU temperature acquired in step S21. Thereafter, the processing proceeds to step S24.

In step S24, the control unit 31 acquires the current CPU temperature from the data stored in the storage unit 33. Then, the processing proceeds to step S25 so that the control unit 31 determines whether or not the current CPU temperature is equal to or less than the upper limit value (e.g., 55° C.).

In step S25, when the control unit 31 determines that the current CPU temperature is equal to or less than the upper limit value (YES), the processing returns to step S24 so that the current CPU temperature is again acquired from the data stored in the storage unit 33 after a predetermined time has passed.

Meanwhile, in step S25, when the control unit 31 determines that the current CPU temperature exceeds the upper limit value (NO), the processing proceeds to step S21 so that the above-described processing is repeated so as to adjust the position of the wall unit 21.

Figure 12:
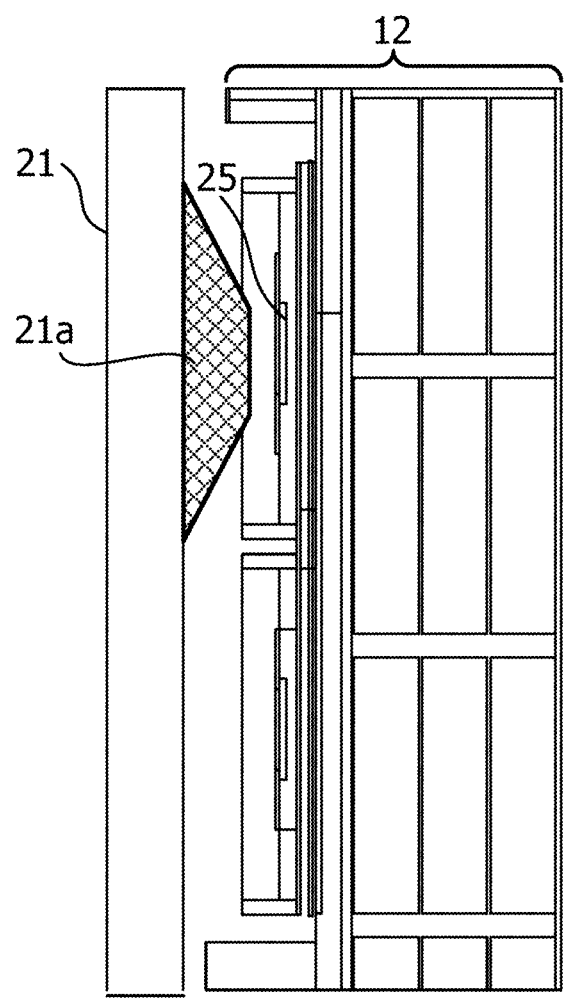
FIG. 12 is a view illustrating a positional relationship between the CPU and a protrusion during a simulation.

FIGS. 10A to 10C and FIGS. 11A to 11C are views illustrating the results of simulating a variation in the temperature of a CPU 25 when a wall unit 21 is moved. Here, as illustrated in FIG. 12, the wall unit 21 is disposed such that the CPU 25 and the protrusion 21*a* of the wall unit 21 face each other, and thereafter, the temperature of the CPUs 25 is examined by moving the wall unit 21 in the vertical direction.

Figure 10C:
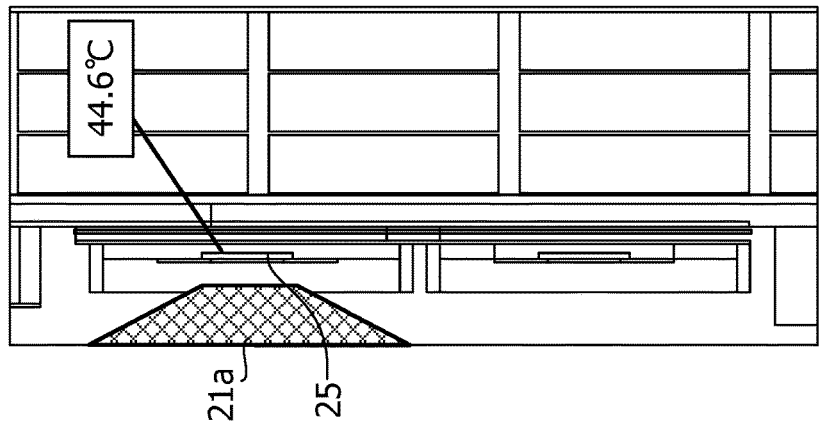
FIGS. 10A to 10C are views (Part 1) illustrating the result of simulating a variation in the temperature of a CPU when the wall unit is moved.
Figure 10B:
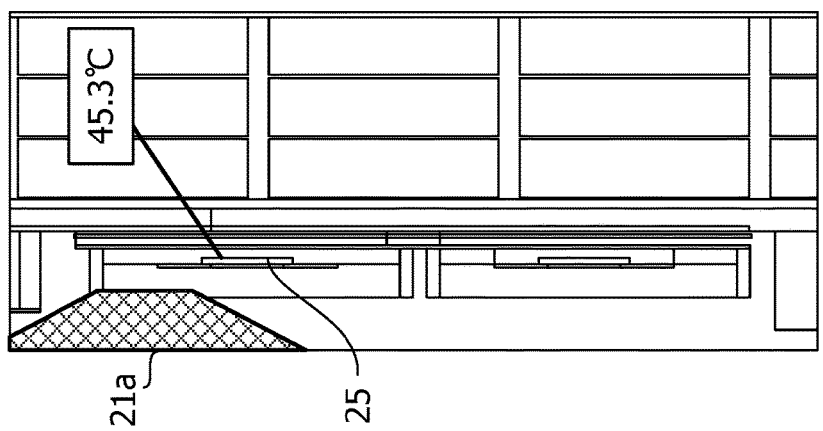
Figure 10A:
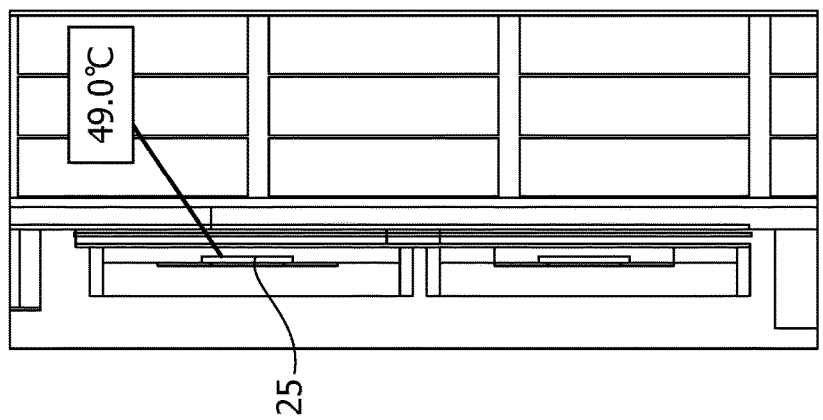

In the example illustrated in FIGS. 10A to 10C and FIGS. 11A to 11C, the temperature of the CPU 25 when the protrusion 21*a* is disposed at a position slightly higher than the CPU 25 (see FIG. 11A) becomes lower than the temperature of the CPU 25 when the protrusion 21*a* is located at the same height as the CPU 25 (see FIG. 10C).

Accordingly, as described above, the position of the wall unit 21 may be actually determined from the result of examining the temperature of the CPU 25 by moving the wall unit 21 in the vertical direction.

In addition, since the optimum position of the wall unit 21 is changed depending on, for example, the temperature of the CPU 25 or the flow rate of the cooling liquid 13, the position of the wall unit 21 may be appropriately changed rather than being fixed once the position has been determined. At this time, in the case where the position of the wall unit 21 is again determined by a variation in the temperature of the CPU 25 or a variation in the flow rate of the cooling liquid 13 after the position of the wall unit 21 is determined, the movement range of the wall unit 21 (the predetermined range in step S22 of FIG. 8) may be reduced to be determined by the processing flow as illustrated in FIG. 8.

Hereinafter, the effect of the present exemplary embodiment will be described.

According to the present exemplary embodiment, since the wall units 21 each having the protrusion 21*a* is disposed in the liquid immersion tank 11, the flow rate of the cooling liquid 13 near the CPUs 25 (the heat generating elements) is increased. Therefore, the amount of cooling liquid 13 per unit time, which comes into contact with the CPUs 25, may be increased without increasing the capability of the pump 16. As a result, the cooling efficiency of the CPUs 25 is increased, and the power required for cooling the CPUs 25 may be reduced while sufficiently cooling the CPUs 25. Since the power consumption of the pump 16 is proportional to the cube of the flow rate, for example, when the flow rate of the pump 16 becomes 50% ($\frac{1}{2}$), the electric power decreases by about 87.5% ($=1-(\frac{1}{2})^3$).

In addition, in the present exemplary embodiment, since the positions of the wall units 21 is frequently changed depending on the temperature of the CPUs 25, the optimum cooling depending on the operating state of the CPUs 25 is possible.

(Modification 1)

Figure 13:
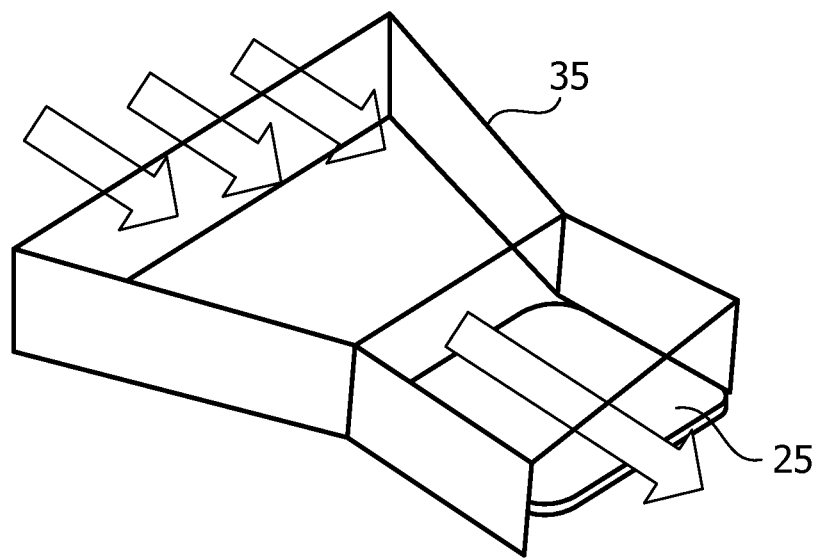
FIG. 13 is a perspective view (schematic view) illustrating a modification 1 of the first exemplary embodiment.

As illustrated in FIG. 13, an auxiliary member 35 having a funnel shape, in which the upstream side is wide and the downstream side is narrow, may be disposed at the upstream side of a CPU 25. Thus, the flow rate of the cooling liquid 13 flowing near the CPU 25 is further increased, and the cooling efficiency of the CPU 25 is further increased.

(Modification 2)

Figure 14:
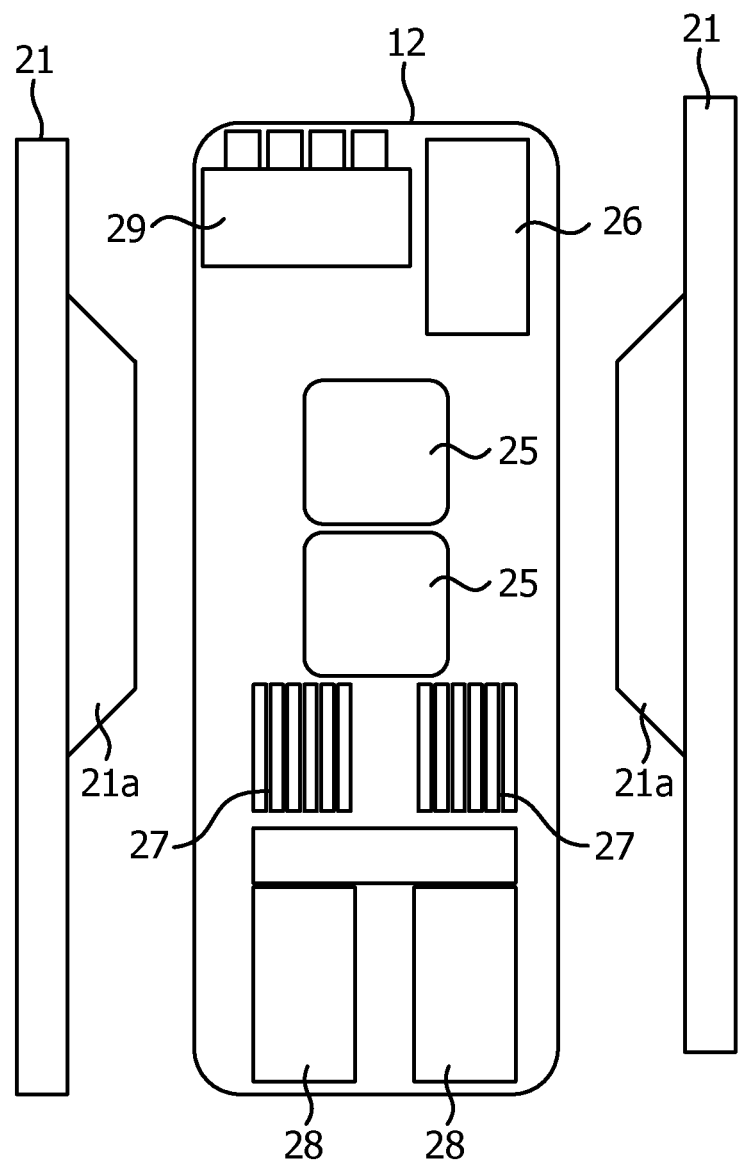
FIG. 14 is a view illustrating a modification 2 of the first exemplary embodiment.

In FIG. 3, two CPUs (heat generating elements) are arranged side by side in the horizontal direction, as illustrated in FIG. 14, in the case where two CPUs are arranged side by side in the vertical direction, the protrusion 21*a* may be elongated in the vertical direction to correspond to the CPUs 25.

(Modification 3)

Figure 15:
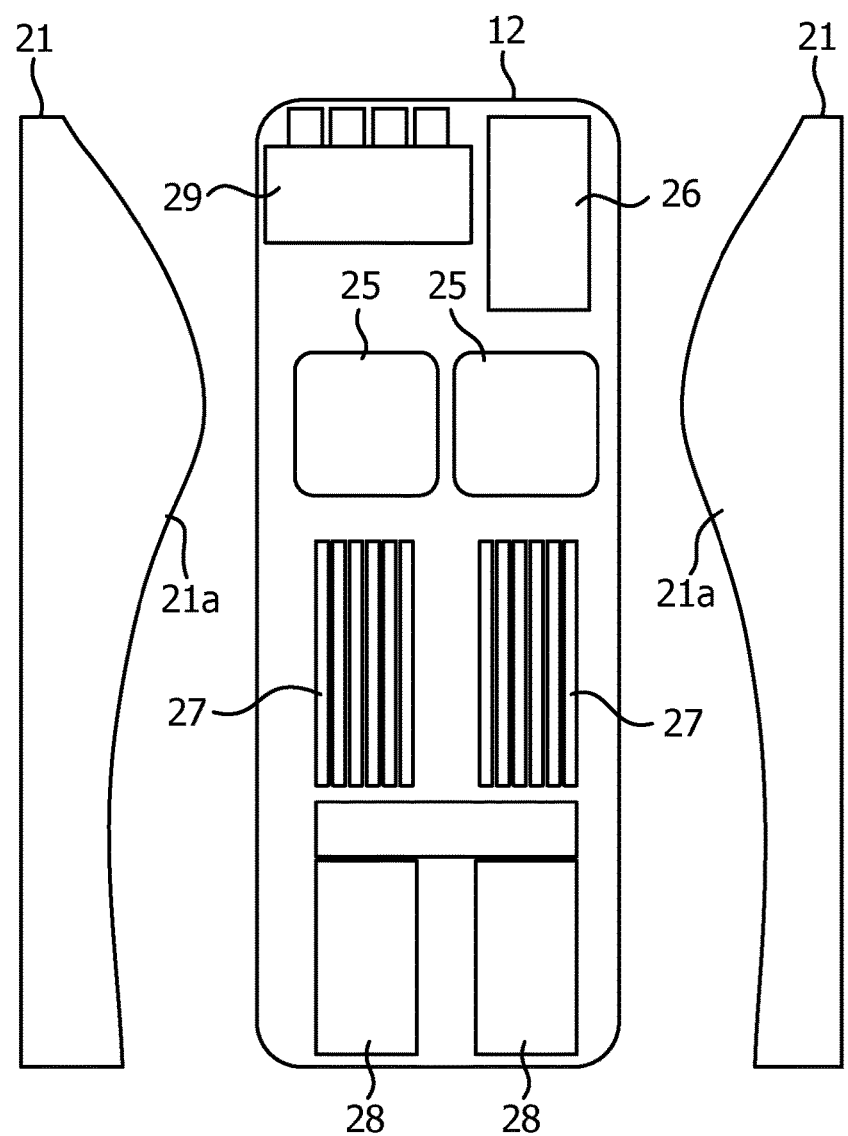
FIG. 15 is a view illustrating a modification 3 of the first exemplary embodiment.

In FIG. 3, each protrusion 21*a* has a trapezoidal shape. However, as illustrated in FIG. 15, the surface of the wall unit 21 (including the protrusion 21*a*) may have a smoothly curved shape. For example, when the surface of the wall unit 21 has a 3-dimensional curved shape in order to reduce resistance against the cooling liquid 13, the cooling efficiency may be further improved.

Second Exemplary Embodiment

Figure 16:
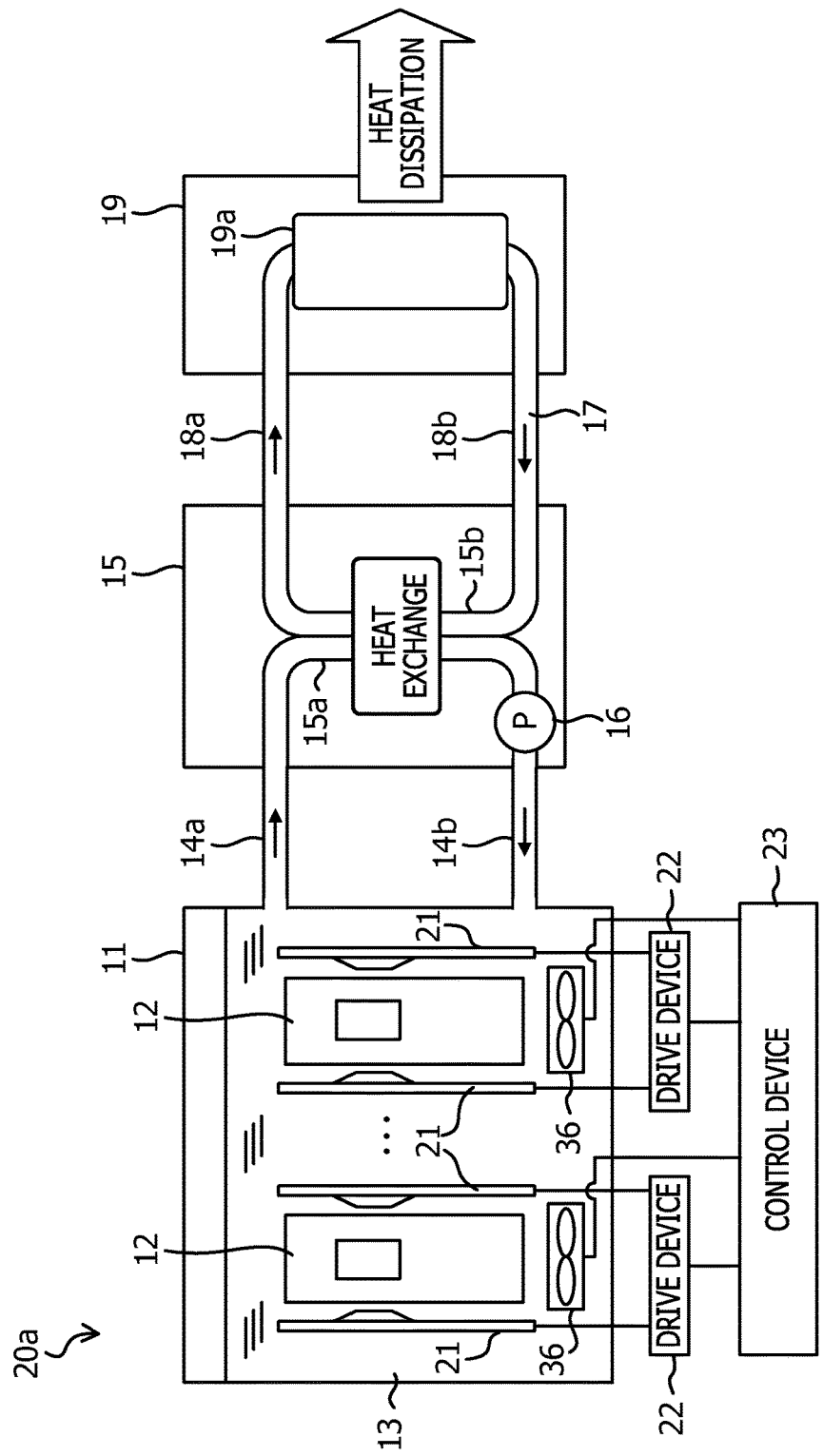
FIG. 16 is a schematic view illustrating a configuration of a liquid immersion cooling system according to a second exemplary embodiment.

FIG. 16 is a schematic view illustrating a configuration of a liquid immersion cooling system according to a second exemplary embodiment. In FIG. 16, the like components are designated by the like reference numerals.

In the liquid immersion cooling system 20*a* according to the present exemplary embodiment, as illustrated in FIG. 16, a submersible fan 36 is disposed below each server 12. The submersible fan 36 is controlled by the control unit 21 of the control device 23 so that a blade thereof is rotated to deliver the cooling liquid 13 upward (between the server 12 and the protrusion 21*a*). The submersible fan 36 is an example of a delivery unit.

Hereinafter, an operation of the liquid immersion cooling system 20*a* according to the present exemplary embodiment will be described with reference to the flowchart illustrated in FIG. 17.

Figure 7:
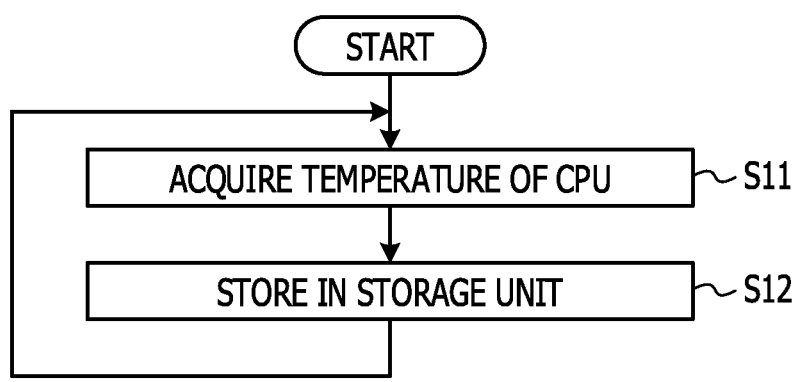
FIG. 7 is a flowchart (Part 1) illustrating an operation of the liquid immersion cooling system according to the first exemplary embodiment.
Figure 8:
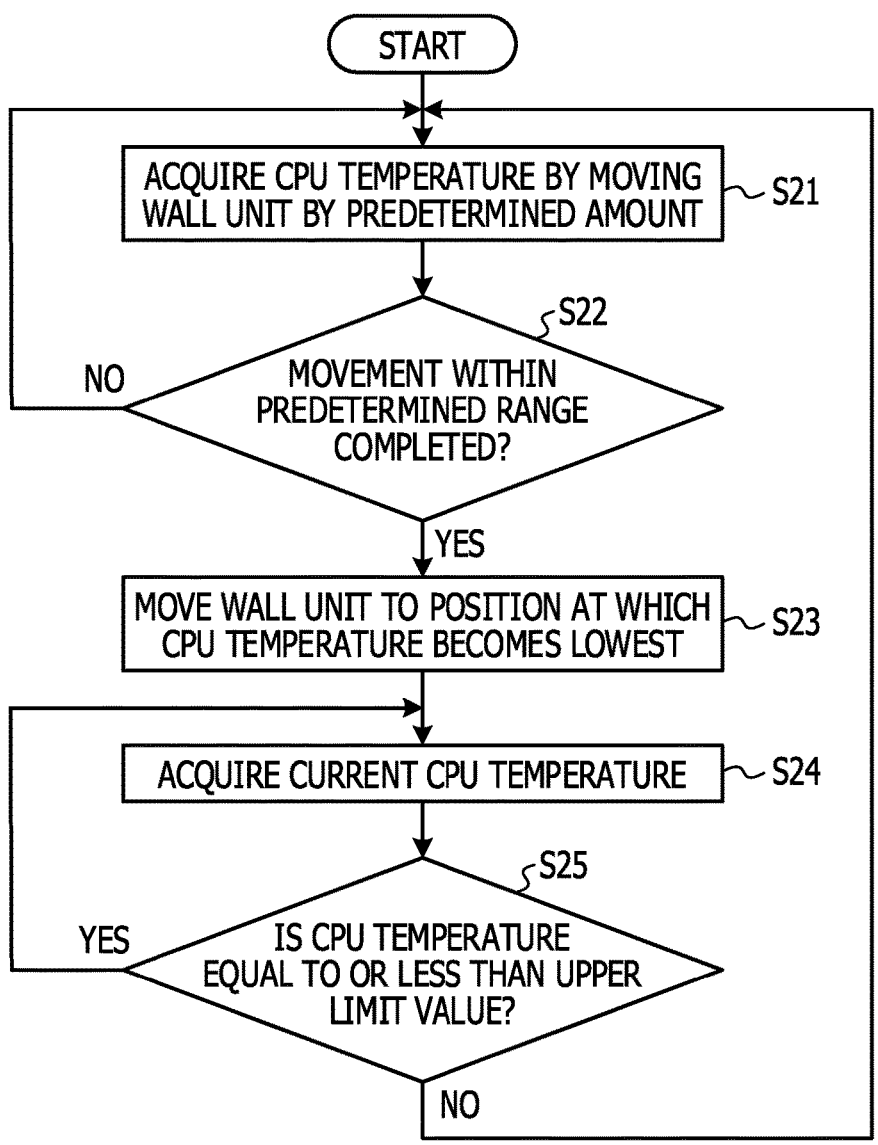
FIG. 8 is a flowchart (Part 2) illustrating an operation of the liquid immersion cooling system according to the first exemplary embodiment.
Figure 17:
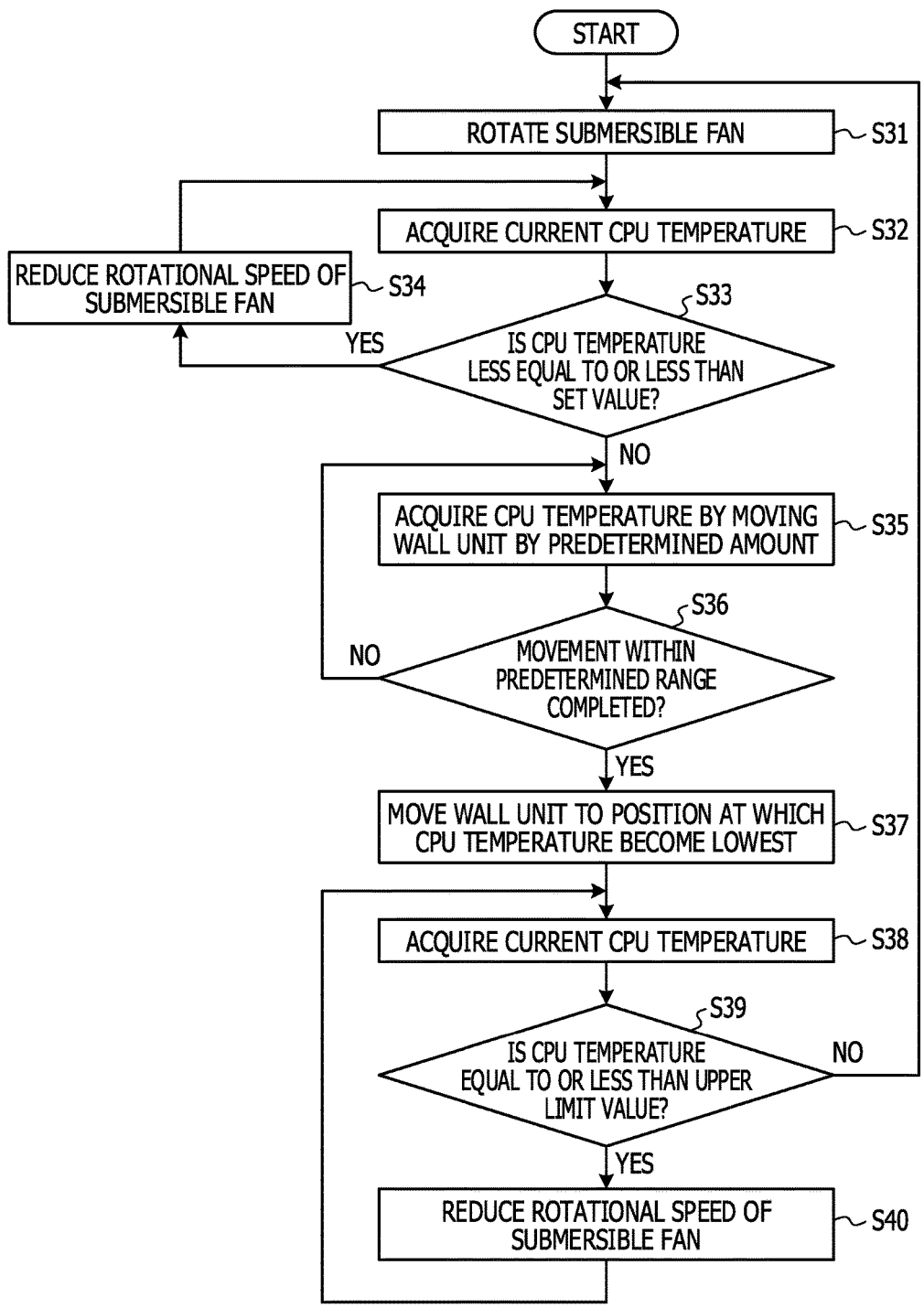
FIG. 17 is a flowchart showing an operation of the liquid immersion cooling system according to the second exemplary embodiment.

Meanwhile, in the present exemplary embodiment, the control device 23 simultaneously performs the processing flow illustrated in FIG. 7 and the processing flow illustrated in FIG. 17. In addition, as illustrated in FIG. 5, the control device 23 includes a control unit 31, a collection unit 32, and a storage unit 33.

First, in step S31 the control unit 31 rotates the submersible fan 36 at a predetermined rotational speed.

Subsequently, the processing proceeds to step S32, and the control unit 31 acquires the current CPU temperature from the storage unit 33. Then, in step S33, the control unit 31 determines whether or not the CPU temperature is equal to or less than a set value (e.g., 40° C.). For example, the set value is set to a temperature slightly higher than the CPU temperature in an idle state.

In step S33, when the control unit 31 determines that the CPU temperature is equal to or less than the set value (YES), the processing proceeds to step S34 such that the rotational speed of the submersible fan 36 is reduced by a predetermined amount, and the processing returns to step S32.

On the other hand, in step S33, when the control unit 31 determines that the CPU temperature exceeds the set value (NO), the processing proceeds to step S35.

In step S35, the control unit 31 moves the wall unit 21 in the vertical direction by a predetermined amount (e.g., 1 cm) via the drive device 22. Then, the control unit 31 acquires the current CPU temperature from the storage unit 33.

Subsequently, the processing proceeds to step S36, and the control unit 31 determines whether or not the movement of the wall unit 21 within a preset predetermined range is completed. In the present exemplary embodiment, it is assumed that the wall unit 21 moves within a range of ±20 cm from the initial state (the position at which the center of the CPU 25 and the center of the protrusion 21*a* are at the same height).

In step S36, when the control unit 31 determines that the movement of the wall unit 21 within the predetermined range has not been completed (NO), the processing proceeds to step S35 so that the wall unit 21 is further moved by a predetermined amount and the CPU temperature is acquired.

Meanwhile, in step S36, when the control unit 31 determines that the movement of the wall unit 21 within the predetermined range is completed (YES), the processing proceeds to step S37. In step S37, the control unit 31 moves the wall unit 21 to the position at which the CPU temperature becomes the lowest with reference to a relationship between the position of the wall unit 21 and the CPU temperature acquired in step S35. Thereafter, the processing proceeds to step S38.

In step S38, the control unit 31 acquires the current CPU temperature from the storage unit 33. Then, the processing proceeds to step S39, and the control unit 31 determines whether or not the current CPU temperature is equal to or less than the upper limit value (e.g., 55° C.).

In step S39, when the control unit 31 determines that the current CPU temperature is equal to or less than the upper limit value (YES), the processing proceeds to step S40. Then, in step S40, after the rotational speed of the submersible fan 36 is reduced, the processing returns to step S38. However, when the rotational speed of the submersible fan 36 is less than a preset rotational speed in step S40, the processing returns to step S38 without changing the rotational speed of the submersible fan 36.

On the other hand, in step S39, when the control unit 31 determines that the current CPU temperature exceeds the upper limit value (NO), the processing proceeds to step S31 and repeats the above-described processing.

In the present exemplary embodiment, since the submersible fan 36 disposed in the lower region of the liquid immersion tank 11 assists the movement of the cooling liquid 13, the load of the pump 16 may be further reduced. In addition, by controlling the rotational speed of the submersible fan 36, the power consumption of the submersible fan 36 is reduced. Thus, in the present exemplary embodiment, the power consumption may be further reduced compared to in the first exemplary embodiment.

FIG. 18 is a view illustrating the result of simulating the effect of the second exemplary embodiment (example) in comparison with a comparative example.

The comparative example relates to the liquid immersion cooling system 10 illustrated in FIG. 1, which does not include the wall unit 21 and the submersible fan 36.

In the comparative example, in order to maintain the temperature of the CPU at about 40° C., it may be required to set the flow rate of the pump 16 to 1 liter/min. In this case, the pump 16 consumes the power of 12 kW.

On the other hand, in the liquid immersion cooling system 30 of the example, the flow rate of the pump 16 required to maintain the CPU temperature at about 40° C. is 0.73 L/min. Thus, while the submersible fan 36 consumes the power of about 1 kW, the power consumed by the pump 16 is 7.3 kW. Accordingly, the sum of the power consumption of the submersible fan 36 and the power consumption of the pump 16 is 8.3 kW.

That is, the liquid immersion cooling system 30 of the example may reduce the power consumption of about 30.8% compared to the comparative example.

Third Exemplary Embodiment

Hereinafter, a third exemplary embodiment will be described. Here, since the third exemplary embodiment is different from the first exemplary embodiment in that the structure of the wall unit is different from that in the first exemplary embodiment, and other configurations are basically the same as those in the first exemplary embodiment, the descriptions of the features redundant with those of the first exemplary embodiment will be omitted.

Figure 19:
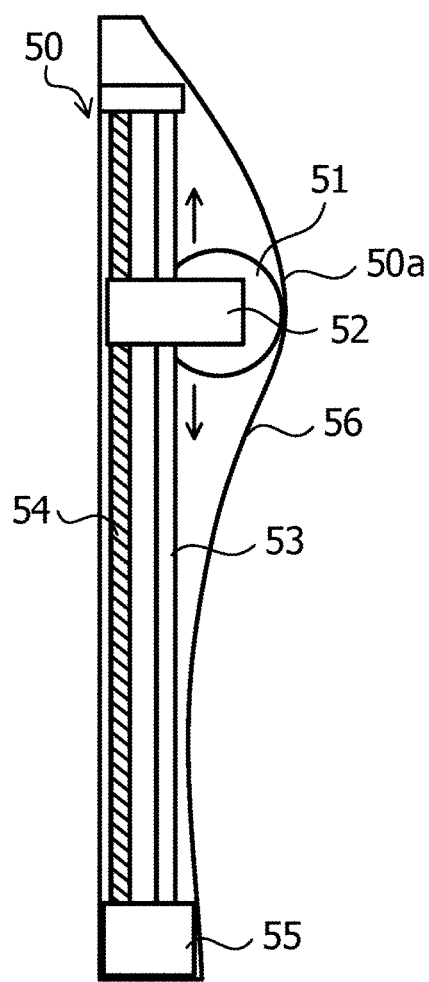
FIG. 19 is a view illustrating a wall unit used in a liquid immersion cooling system according to a third exemplary embodiment.

FIG. 19 is a view illustrating a wall unit 50 used in a liquid immersion cooling system according to the third exemplary embodiment.

As illustrated in FIG. 19, the wall unit 50 includes a roller 51, a roller support unit 52, two support posts 53, a lead screw (feed screw) 54, and a drive device 55. In addition, the surface of the wall unit 50 toward the server 12 is formed by a sheet-shaped member 56, which is formed of a flexible material, such as rubber.

All the support posts 53 and the lead screw 54 are disposed to have vertical axes. The roller 51 is supported by the roller support unit 52 to have a horizontal rotation axis. In addition, the roller support unit 52 is supported by the two support posts 53 to be movable in the vertical direction, and moves in the vertical direction along the support post 53 by the rotation of the lead screw 54. The lead screw 54 is controlled by the control device 23 (see FIG. 5) via the drive device 55.

When the roller 51 compresses the sheet-shaped member 56, a protrusion 50a is formed on the surface of the wall unit 50 toward the server. In addition, when the roller 51 moves in the vertical direction via the rotation of the lead screw 54, the protrusion 50a of the wall unit 50 moves in the vertical direction.

Since the driving method of the drive device 55 is basically the same as the driving method of the drive device 22 in the first exemplary embodiment (see FIG. 5), the description thereof will be omitted herein.

In the first exemplary embodiment, the position of the protrusion 21a is adjusted by moving the wall unit 21 in the vertical direction. On the contrary, in the present exemplary embodiment, the position of the protrusion 50a is adjusted by moving the roller 51 without changing the position of the wall unit 50.

In the present exemplary embodiment, the same effect as in the first exemplary embodiment may be acquired.

(Modification)

Figure 20:
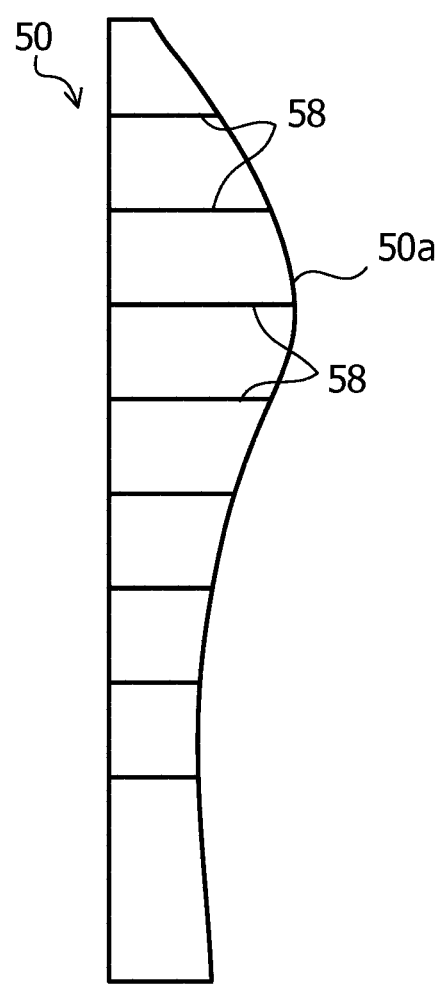
FIG. 20 is a view illustrating a modification of the third exemplary embodiment.

FIG. 20 is a view illustrating the wall unit 50 of a modification of the third exemplary embodiment.

In the wall unit 50 illustrated in FIG. 19, the position of the protrusion 50a is adjusted by moving the roller 51 in the vertical direction. However, for example, as illustrated in FIG. 20, the protrusion 50a may be formed on the wall unit 50 by providing partitions 58 within the wall unit 50 to divide the space within the wall unit 50 into a plurality of spaces, and introducing air (or other fluids) into each space. In this case, the position of the protrusion 50a may be moved by changing the amount of air to be introduced into each space.

In the above-described respective exemplary embodiments descriptions have been made with reference to the case where the cooling liquid is a fluorine-based active liquid. However, any liquid other than the fluorine-based active liquid may be used as the cooling liquid.

In addition, in the above-described respective exemplary embodiments, descriptions have been made with reference to the case where all electronic devices are servers. However, the disclosed technology may be applied to the cooling of electronic devices other than the servers.

Further, in each exemplary embodiment, each server is vertically disposed in the liquid immersion tank so that the cooling liquid flows in the vertical direction (from the bottom to the top). However, the disclosed technology may also be used in the case where the server is horizontally disposed such that the cooling liquid flows in the horizontal direction. In this case, the wall unit may be disposed parallel to the server (i.e., horizontally), and the protrusion may be moved in the horizontal direction.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the exemplary embodiments of the present invention have been described in detail, it should be understood that the various changes, substitutions, and alterations could be made hereto without departing from the spirit and scope of the invention.

What is claimed is:

1. A liquid immersion cooling apparatus comprising:
   a liquid immersion tank that accommodates a cooling liquid and an electronic device including a heat generating element to be immersed in the cooling liquid within the liquid immersion tank, the liquid immersion tank being coupled to a heat exchanger that cools the cooling liquid from the liquid immersion tank;
   a wall that is disposed within the liquid immersion tank, the wall having a protrusion protruding toward the electronic device;
   a pump that circulates the cooling liquid between the liquid immersion tank and the heat exchanger: and
   a wall driver including a winder that moves a position of the protrusion formed on the wall along the electronic device.

2. The liquid immersion cooling apparatus according to claim 1, wherein the wall driver moves the wall when moving the position of the protrusion.

3. The liquid immersion cooling apparatus according to claim 1, wherein the wall driver moves only the protrusion of the wall when moving the position of the protrusion.

4. The liquid immersion cooling apparatus according to claim 1, further comprising:
   a fan disposed in the liquid immersion tank to send the cooling liquid between the heat generating element and the protrusion.

5. The liquid immersion cooling apparatus according to claim 4, wherein the fan is disposed on a bottom portion of the liquid immersion tank.

6. A liquid immersion cooling system comprising:
   a liquid immersion tank that accommodates a cooling liquid and an electronic device including a heat generating element, the electronic device being immersed in the cooling liquid within the liquid immersion tank;
   a wall disposed within the liquid immersion tank, the wall having a protrusion protruding toward the electronic device;
   a pump that circulates the cooling liquid between the liquid immersion tank and a heat exchanger; and
   a wall driver including a winder that moves a position of the protrusion formed on the wall along the electronic device.

7. The liquid immersion cooling system according to claim 6, further comprising:
   a temperature sensor that detects a temperature of the heat generating element; and
   a control device that controls the wall driver based on an output of the temperature sensor.

8. The liquid immersion cooling system according to claim 6, wherein the cooling liquid is a fluorine-based inert liquid.

9. The liquid immersion cooling system according to claim 6, wherein the protrusion moves in a direction parallel to a flow direction of the cooling liquid near the electronic device.

10. A control method of a liquid immersion cooling apparatus that cools an electronic device including a heat generating element, the method comprising:
    immersing the electronic device in a cooling liquid within an immersion tank and circulating the cooling liquid between the liquid immersion tank and a heat exchanger;
    disposing a wall in the liquid immersion tank, the wall having a protrusion protruding toward the electronic device; and
    moving a position of the protrusion formed on the wall by a wall driver including a winder depending on a temperature of the heat generating element.

11. The control method according to claim 10, wherein a control device acquires the temperature of the heat generating element while moving the protrusion, and based on the acquired temperature, the control device disposes the protrusion at a position where the temperature of the heat generating element becomes the lowest.

12. The liquid immersion cooling apparatus according to claim 1, wherein the wall driver further includes a pulley.

13. The liquid immersion cooling apparatus according to claim 1, wherein the wall driver further includes a roller, and a lead screw.

* * * * *